(12) United States Patent
Endo et al.

(10) Patent No.: US 6,507,384 B1
(45) Date of Patent: Jan. 14, 2003

(54) FLEXIBLE PRINTED WIRING BOARD, ELECTRO-OPTICAL DEVICE, AND ELECTRONIC EQUIPMENT

(75) Inventors: Kogo Endo, Chino (JP); Eiji Oishi, Shimosuwa-machi (JP); Yasuhito Aruga, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/534,936

(22) Filed: Mar. 24, 2000

(30) Foreign Application Priority Data

| Mar. 26, 1999 | (JP) | ............................ 11-084770 |
| Jan. 31, 2000 | (JP) | ...................... 2000-021607 |
| Jan. 31, 2000 | (JP) | ...................... 2000-022890 |

(51) Int. Cl.⁷ .......................................... G02F 1/1345
(52) U.S. Cl. ....................... 349/149; 349/150; 349/151; 349/152
(58) Field of Search ................... 349/149, 151, 349/152; 257/59; G02F 1/1345

(56) References Cited

U.S. PATENT DOCUMENTS

| 3,633,189 | A |   | 1/1972  | Billawala |         |
| 5,200,847 | A | * | 4/1993  | Mawatari et al. | 349/151 |
| 5,712,493 | A | * | 1/1998  | Mori et al. | 257/59 |
| 5,737,053 | A | * | 4/1998  | Yomogihara et al. | 349/149 |
| 6,005,652 | A | * | 12/1999 | Matsuhira | 349/149 |
| 6,160,605 | A | * | 12/2000 | Murayama et al. | 349/152 |

FOREIGN PATENT DOCUMENTS

| EP | 0 694 927    |   | 1/1996  |              |
| JP | 03-239284    |   | 10/1991 |              |
| JP | 4-50819 A    | * | 2/1992  | ......... G02F/1/1345 |
| JP | 04-104621 U  |   | 9/1992  |              |
| JP | 5-224224 A   | * | 9/1993  | ......... G02F/1/1345 |
| JP | 6-43472 A    | * | 2/1994  | ......... G02F/1/1345 |
| JP | 06-242462 A  |   | 9/1994  |              |
| JP | 06-342166 A  |   | 12/1994 |              |
| JP | 07-263485 A  |   | 10/1995 |              |
| JP | 07-270814 A  |   | 10/1995 |              |
| JP | 08-006058 A  |   | 1/1996  |              |
| JP | 08186348     |   | 7/1996  |              |
| JP | 1026833      |   | 10/1998 |              |

* cited by examiner

*Primary Examiner*—Kenneth Parker
*Assistant Examiner*—David Chung
(74) *Attorney, Agent, or Firm*—Harness, Dickey & Pierce, P.L.C.

(57) ABSTRACT

Connection terminals connected to a scanning driver IC chip 32 are arranged on a short side of a wiring connection area 25A of a second substrate 25 in a liquid crystal display panel 21, and the connection terminals and connection terminals arranged on a long side of a wiring connection area 24A of a first substrate 24 are connected from the same direction with a single flexible printed wiring board 22. For this reason, convenience of the flexible printed wiring board 22 can be improved. In addition, it is possible to reduce the projection size of the wiring connection area of the first substrate 24, and the ratio of the display area in the whole liquid crystal panel 21 can be increased.

12 Claims, 11 Drawing Sheets

PRIOR ART

FLEXIBLE PRINTED WIRING BOARD, ELECTRO-OPTICAL DEVICE, AND ELECTRONIC EQUIPMENT

BACKGROUND

1. Industrial Field of the Invention

The present invention relates to an electro-optical device, such as a liquid crystal device or an EL (electroluminescent) electro-optical device. The present invention also relates a flexible printed wiring board for use in the electro-optical device, and to electronic equipment including the electro-optical device.

2. Description of the Related Art

In recent years, electro-optical devices have been widely used as information display terminals in portable devices, homes, offices, factories, automobiles, and the like. In particular, liquid crystal display devices have characteristics of low profile, low weight, low voltage, and low power consumption. For this reason, liquid crystal devices are the dominant devices of electronic display both now and in the future, and are actively applied to PDA (Personal Digital Assistants) and the like by making use of the low power consumption.

As one example of conventional liquid crystal display devices, FIG. 9 shows a passive-matrix-driven-type liquid crystal display device 1. The liquid crystal display device 1 is basically composed of a liquid crystal display panel 2 and a printed board 3. The liquid crystal display panel 2 and the printed board 3 are electrically connected via first and second flexible printed wiring boards 4 and 5.

The liquid crystal display panel 2 has a pair of glass substrates 6 and 7 that are arranged to oppose each other. A sealing material (not shown) is provided between the glass substrates 6 and 7 so as to surround a display area. Liquid crystal is sealed in a gap formed by the glass substrates 6 and 7 and the sealing material. On a surface of the glass substrate 6 opposing the glass substrate 7 (opposing surface of the glass substrate 6), a plurality of signal electrodes 8 are formed in parallel with each other. On the other hand, on a surface of the glass substrate 7 opposing the glass substrate 6 (opposing surface of the glass substrate 7), a plurality of scanning electrodes 9 are formed in a direction perpendicular to the signal electrodes 8.

At a predetermined side edge portion (lower side edge portion in FIG. 9) of the liquid crystal panel 2, an edge of the glass substrate 6 is set to project sideways (downward in FIG. 9) from an edge of the glass substrate 7. The projected area (area in which the glass substrate 6 does not overlap the glass substrate 7) constitutes a wiring connection area 6A. In addition, at a side edge portion (left side edge portion) of the liquid crystal display panel 2 adjacent to the above-described side edge portion, an edge of the glass substrate 7 is set to project sideways (leftward in FIG. 9) from the edge of the glass substrate 6. The projected area (area in which the glass substrate 7 does not overlap the glass substrate 6) constitutes a wiring connection area 7A. Signal driver IC chips 10 and 11 are mounted by a COG (Chip on Glass)-technique on the wiring connection area 6A of the glass substrate 6. These signal driver IC chips 10 and 11 are connected to output terminals 8A having a plurality of the extended signal electrodes 8 and to input terminals 12 formed on the edge of the wiring connection area 6A. A scanning driver IC chip 13 is COG-mounted on the wiring connection area 7A of the glass substrate 7. The scanning driver IC chip 13 is connected to output terminals 9A having a plurality of the extended scanning electrodes 9 and to input terminals 14 formed on the edge of the wiring connection area 7A.

An output terminal area 4A of the first flexible printed wiring board 4 is connected via an anisotropic conductive film (ACF) so as to be electrically connected to the plurality of input terminals 12 arranged along the long side of the wiring connection area 6A of the glass substrate 6. Similarly, an output terminal area 5A of the second flexible printed wiring board 5 is connected via an anisotropic conductive film so as to be electrically connected to the plurality of input terminals 14 disposed along the long side of the wiring connection area 7A of the glass substrate 7.

An input terminal area 4B of the first flexible printed wiring board 4 is connected to output terminals 15 formed on the printed board 3 via an anisotropic conductive film or a filter. An input terminal area 5B of the second flexible printed wiring board 5 is connected to output terminals 16 formed on the printed board 3 via an anisotropic conductive film or a filter. The printed board 3 has a predetermined wiring formed thereon and various types of electronic parts mounted thereon. The input terminal area 4B of the first flexible printed wiring board 4 and the input terminal area 5B of the second flexible printed wiring board 5 are connected by different portions, which are offset from each other, of the printed board 3.

As an example of the electronic equipment using the liquid crystal display device having the above-described construction, an electronic equipment includes an input unit, such as a keyboard or a 10-button keypad and displays data by a liquid crystal display panel according to input operation to the input unit. In such an electronic equipment, a liquid crystal display panel and a printed board are incorporated into a chassis (panel-accommodating frame). In this case, two flexible printed wiring boards are bent into the device so that the printed board is arranged at the back of the liquid crystal display panel.

In the above-described liquid crystal display device and the electronic equipment using the liquid crystal display device, however, a display area of the liquid crystal display panel may become small and visibility may be deteriorated when the weight and thickness of the device are reduced to pursue portability. In a portable information device, such as a mobile phone or a pocket size personal computer in which portability is very important, a width of a casing or a width of a frame outside the display area has been reduced to the limit.

As shown in FIG. 10, in the liquid crystal display 1 having the above-described construction, the wiring connection area 7A exists in the lateral direction (left side in the figure), and the wiring connection area 7A is required to secure a width x1 for mounting the scanning driver IC chip 13, a predetermined connection margin x2 for connecting the output terminal area 5A of the flexible printed wiring board 5, and a size x3 for separating the scanning driver IC chip 13 and the output terminal area 5A of the flexible printed wiring board 5. For this reason, there is a problem in that the ratio of the display area accounting for the entire surface of the liquid crystal display panel 2 decreases with a decrease in the width of the liquid crystal display panel 2.

The problem caused by the wiring connection area in the liquid crystal display panel is not limited to a case where a liquid crystal display device or an electronic equipment using the liquid crystal display device is reduced in size. That is, even in an electronic equipment including a relatively large liquid crystal display device, it is demanded that a display area in a casing, such as a chassis, for accommodating the display device is enlarged to the fullest extent by reducing a width of a frame outside a display area of the liquid crystal display panel.

Furthermore, in the above-described liquid crystal display device 1, it is necessary to independently join the flexible printed wiring board 4, which is to be connected to a wiring connection area 6A of the glass substrate 6 having the signal driver IC chips 10 and 11 mounted thereon, and the flexible printed wiring board, which is to be connected to the wiring connection area 7A of the glass substrate 7 having the scanning driver IC chip 13 mounted thereon, to the surface and the back of the printed board 3. For this reason, a modular process becomes complicated and lacks convenience. Since the flexible printed wiring boards 4 and 5 are separately connected to the printed board 3, it is undesirable that the output terminals 15 and 16 formed on the printed board 3 are too close to each other. That is, when connecting the flexible printed wiring boards 4 and 5 using a mounting machine, it is necessary to secure a distance in which the flexible printed wiring boards do not interfere with each other. In this way, the use of a plurality of (in this embodiment, two) flexible printed wiring boards is a factor that prevents a reduction in size of the printed board 3.

It would be desired to provide an electro-optical device capable of simplifying a terminal connecting process and enlarging, for example, an occupancy area of a display area.

In addition, it would be desired to provide a highly convenient flexible printed wiring board.

Furthermore, it would be desired to provide an electronic equipment having a simple modular process, and capable of performing, for example, high visibility display using the electro-optical device according to the present invention.

SUMMARY OF THE INVENTION

According to the present invention, there is provided a flexible printed wiring board having wiring formed on an insulating flexible board by a predetermined pattern, the flexible printed wiring board comprising:

a board main body;

a branch wiring section branched from the board main body;

a first output terminal area provided on the board main body;

a second output terminal area provided on the branch wiring section; and an input terminal area;

wherein the first output terminal area is provided on one surface of the board main body;

the second output terminal area is provided on a surface opposite to the surface on which the first output terminal area is provided;

wiring of the input terminal area is provided on one surface of the flexible board;

the wiring of the first and second output terminal areas is continuously connected to the wiring of the input terminal area; and an arrangement direction of the wiring in the first output terminal area is the same as an arrangement direction of the wiring in the second output terminal area.

According to the flexible printed wiring board of the present invention, for example, the first substrate and the second substrate can be connected by the single flexible printed wiring board. As a result, according to the present invention, since the number of flexible printed wiring board can be decreased, connecting operation can be simplified.

With this construction, for example, when semiconductor devices, such as driver IC chips are mounted on the opposing surfaces of the first substrate and the second substrate, the single flexible printed wiring board can be connected to the opposing surfaces. In addition, it is possible to join the other end of the flexible printed wiring board connected to the semiconductor devices, for example, to a printed board on which various types of electronic elements, such as power IC chips.

A part of the wiring of the input terminal area may preferably be connected to the wiring of either the first or second output terminal areas formed on the surface opposite to the surface on which the input terminal area is formed via through holes. With this construction, the wiring can be formed on both sides of the flexible substrate via the through holes. As a result, the single flexible printed wiring board can take connections to different surfaces, which are opposing each other.

The branch wiring section may extend in substantially an L-shape from the board main body. In addition, an end of the branch wiring section may be located forward from an end of the board main body.

According to the present invention, there is provided an electro-optical device having an electro-optical material layer formed between a first substrate and a second substrate opposing each other, wherein:

the first substrate includes a first wiring connection area which does not overlap the second substrate;

the second substrate includes a second wiring connection area which does not overlap the first substrate;

the first wiring connection area and the second wiring connection area are connected to the flexible printed wiring board according to the present invention;

the first output terminal area of the flexible printed wiring board is connected to the first wiring connection area;

the second output terminal area of the flexible printed wiring board is connected to the second wiring connection area; and a direction in which the first output terminal area is connected to the first wiring connection area is the same as a direction in which the second output terminal area is connected to the second wiring connection area.

In the electro-optical device according to the present invention, the first and second output terminal areas of the flexible printed wiring board are connected to the first wiring connection area of the first substrate and the second wiring connection area of the second substrate in the same direction. In other words, the flexible printed wiring board may be connected to the two adjacent wiring connection areas of the first and second substrates not in both of the X and Y directions but in one direction of the X direction or the Y direction. Therefore, the electro-optical device of the present invention has a construction in which the two output terminal areas of the flexible printed wiring board are connected to a long side of one wiring connection area and a short side of the other wiring connection area.

With this construction, it is not necessary to arrange an input wiring terminal used for connection with the flexible printed wiring board on the long side of one of the first wiring connection area and the second wiring connection areas. As a result, a connection margin for the flexible printed wiring board is not required on the long side of one of the wiring connection areas, and the projection size (width) of the wiring connection area can be reduced.

According to the electro-optical device of the present invention, by reducing the projection size of one of the wiring connection areas, for example, the ratio of a display area accounting for the whole of the display panel can be increased. By increasing the ratio of the display area in this way, the width of a display frame surrounding a display opening of a casing (chassis) for accommodating the display panel can be narrowed, and display visibility can be improved.

The electro-optical device of the present invention has an advantage of simplifying a terminal connecting process since the flexible printed wiring board is connected from one direction of the display panel.

Furthermore, according to the electro-optical device of the present invention, convenience of the flexible printed wiring board can be improved since the wiring connection areas of the two substrates can be connected using the single flexible printed wiring board. As a result, in the present invention a modular step for incorporating the electro-optical device into the electronic equipment can be simplified.

Furthermore, the electro-optical device of the present invention can take the following various forms.

(a) A semiconductor device is mounted on at least one of, or preferably, both of the first wiring connection area and the second wiring connection areas. The semiconductor device can include a driver IC chip.

(b) The input terminal area of the flexible printed wiring board is connected to a printed board. With this construction, the output terminal areas of the flexible printed wiring board that are integrally connected to the first and second output terminal areas can be connected to the printed board at one place. For this reason, connecting of the printed board and the flexible printed wiring board is simplified. In addition, the size of the printed board can be reduced since the flexible printed wiring board can be connected to the printed board at one place as described above.

(c) Signal wiring is provided in the first output terminal area, and scanning wiring is provided in the second output terminal area. With this construction, the ratio of the display area accounting for the whole of the display panel can be increased in a passive-matrix-driven-type liquid crystal display device and an EL display device in which the scanning electrodes and the signal electrodes intersect each other, or in an active-matrix-driven-type liquid crystal display device including TFD (Thin Film Diode) elements for each of pixels.

(d) At least one of the first and second substrates is transparent to display light, and at least one of the scanning electrodes and the signal electrodes transparent to the display light are formed on the transparent substrate. With this construction, the ratio of the display area accounting for the whole of the display panel of a reflective display device and a transmissive display device can be increased.

(e) The electro-optical material layer may preferably be a liquid crystal layer. With this construction, assembly convenience of the electro-optical device in a portable information terminal can be increased, and an increase in the ratio of the display area can improve display visibility.

The electronic equipment of the present invention includes the electro-optical device according to the present invention.

The electronic equipment includes, for example, the electro-optical device of the present invention and an input unit for inputting a signal to a driving system of the electro-optical device, and a display panel is accommodated in a casing and the casing is formed with an opening for exposing the whole display area of the display panel. With this construction, the ratio of the area of the opening of the casing can be increased, and a width of a frame surrounding a display unit can be narrowed. For this reason, even if the size of the electronic equipment is reduced, a reduction of the display area can be restricted, and the advantage of improving display visibility is provided.

DETAILED DESCRIPTION OF THE PREFERRED EMBODIMENTS

Figure 1:
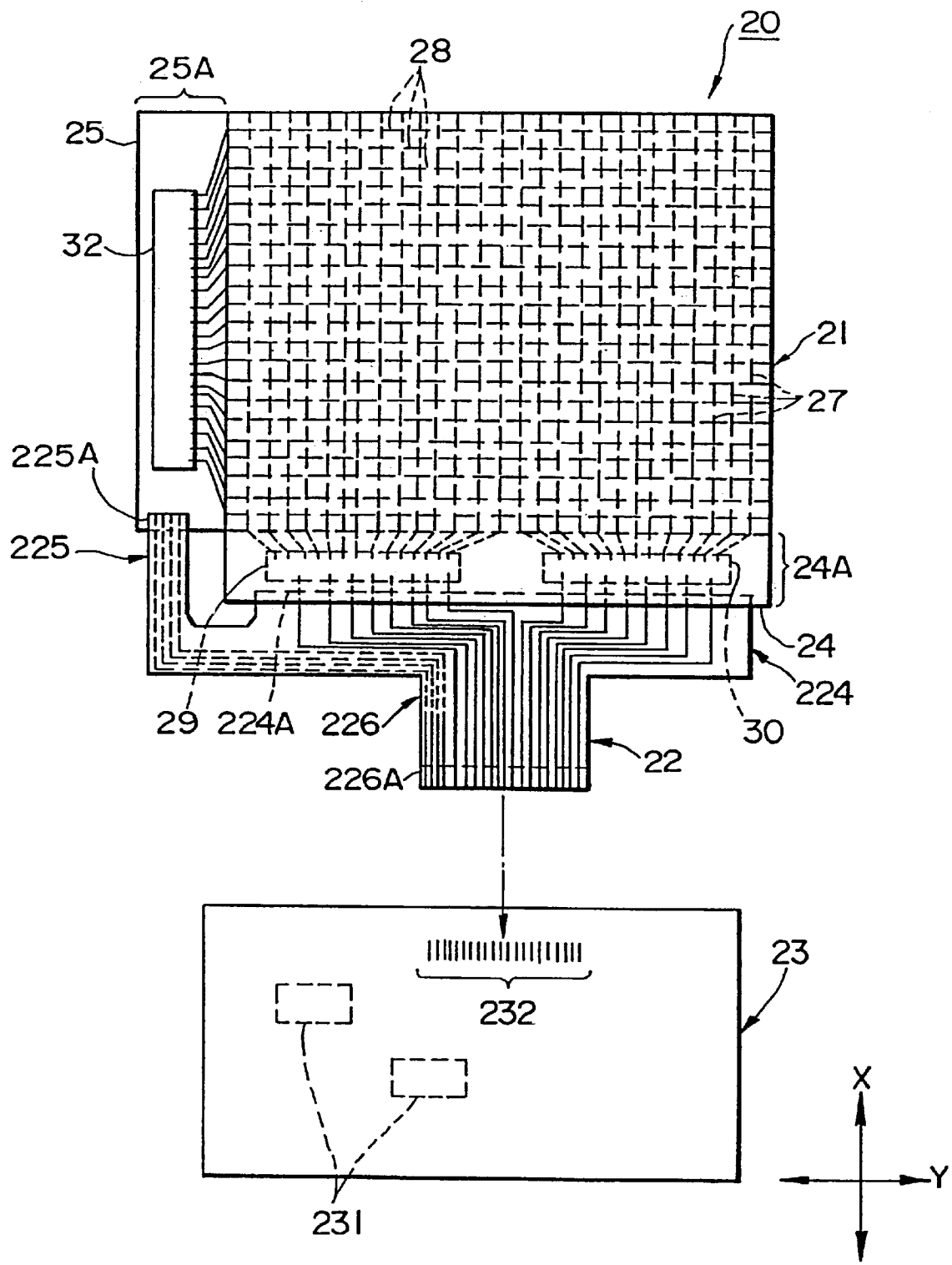
FIG. 1 is an exploded plan view showing an embodiment of a liquid crystal display device to which an electro-optical device of the present invention is applied.

Details of a liquid crystal device (in this embodiment, a liquid crystal display device), a flexible printed wiring board, and an electronic equipment will now be described with reference to an embodiment shown in the drawings. FIGS. 1 to 7 show an embodiment in which the present invention is applied to a passive-matrix-driven-type reflective liquid crystal display device.

As shown in FIG. 1, a liquid crystal display device 20 according to the present invention includes a liquid crystal display panel (electro-optical panel) 21, a flexible printed wiring board 22 connected to a first substrate 24 and a second substrate 25 which constitute the liquid crystal display panel 21, and a printed board 23 connected to the flexible printed wiring board 22.

Firstly, the liquid crystal display panel 21 will be described.

The liquid crystal display panel 21 has the first substrate 24 and the second substrate 25 which are arranged to oppose each other. A sealing material (not shown) is provided between the first substrate 24 and the second substrate 25 so as to surround a display area. Liquid crystal layer (not shown) is sealed in an area formed by the first and second substrates 24 and 25 and the sealing material. The first and second substrates 24 and 25 are composed of, for example, a glass substrate or a plastic substrate.

On a surface of the first substrate 24 opposing the second substrate 25 (hereinafter, referred to as an "opposing surface of the first substrate 24"), a plurality of data signal electrodes 27 are arranged in parallel with each other. The signal electrodes 27 are formed of a conductive material which is transparent to display light, such as ITO (Indium Tin Oxide). The signal electrodes 27 are arranged at predetermined intervals along a predetermined direction (X direction in FIG. 1). On the other hand, on a surface of the second substrate 25 opposing the first substrate 24 (hereinafter, referred to as an "opposing surface of the second substrate 24"), a plurality of scanning electrodes 28 are arranged. These scanning electrodes 28 are formed of a conductive material reflecting the display light, such as a metal, for example, aluminum, aluminum alloy, or a silver-palladium-copper alloy. These scanning electrodes 28 are arranged in parallel with each other at predetermined intervals along a predetermined direction (Y direction in FIG. 1). That is, the plurality of signal electrodes 27 formed on the first substrate 24 and the plurality of scanning electrodes 28 formed on the second substrate 25 mutually perpendicularly intersect to form a so-called X-Y matrix.

The liquid crystal display panel 21 has a first wiring connection area 24A and a second wiring connection area 25A at two adjacent sides thereof. An edge of the first substrate 24 projects downward in FIG. 1 from an edge of the second substrate 25, and the first wiring connection area 24A is formed on opposing surface of the first substrate 24 where the first substrate 24 does not overlap the second substrate 25. An edge of the second substrate 25 projects leftward in FIG. 1 from an edge of the first substrate 24, and the second wiring connection area 25A is formed on opposing surface of the second substrate 25 where the second substrate 25 does not overlap the first substrate 24.

Figure 2:
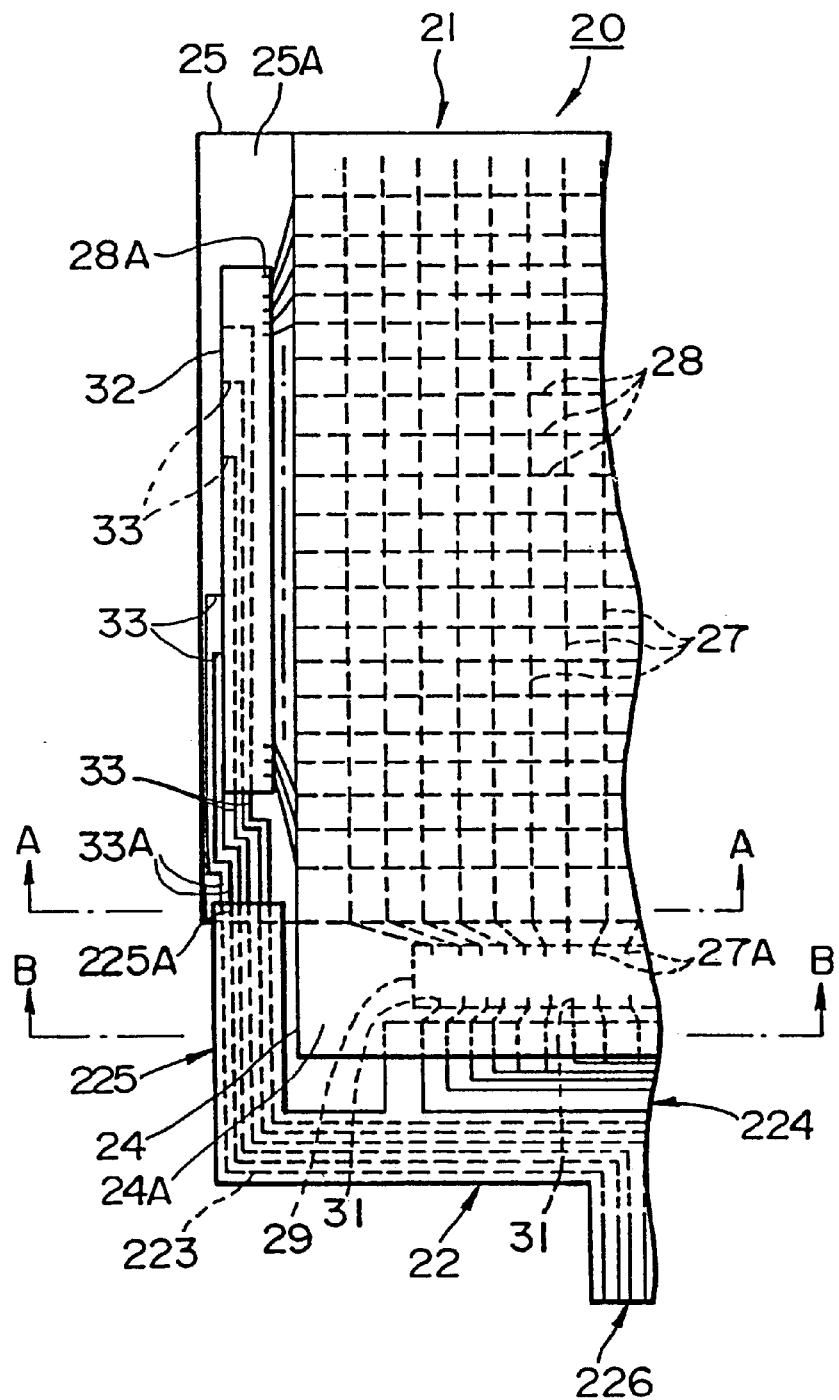
FIG. 2 is an enlarged plan view of a principal part of the liquid crystal display device of the embodiment.

Data signal driver (X driver) IC chips 29 and 30 are mounted on the first wiring connection area 24A of the first substrate 24. A mounting method of the signal driver IC chips 29 and 30 is not particularly limited, and they are mounted by, for example, a COG (Chip on Glass) method. These signal driver IC chips 29 and 30 are connected to terminals 27A which are continuous with the signal electrodes 27, and to connection terminals 31 which are arranged on the long side of the first wiring connection area 24A of the first substrate 24, as shown in FIG. 2. The signal driver IC chips 29 and 30 are, for example, face down flip-chip-mounted on the terminals 27A of the signal electrodes 27 and the connection terminals 31.

On the other hand, a scanning driver IC chip 32 is, for example, COG-mounted on the second wiring connection area 25A of the second substrate 25, as shown in FIG. 2. The scanning IC driver chip 32 is connected to terminals 28A of the plurality of scanning electrodes 28 and to a plurality of connection terminals 33. The scanning driver IC chip 32 is, for example, face-down flip-chip-mounted on the terminals 28A of the scanning electrodes 28 and the connection terminals 33. Furthermore, the connection terminals 33 are arranged in such a manner that they are routed at the second wiring connection area 25A and input terminals 33A thereof extend to an end of the flexible printed wiring board 22.

Figure 10:
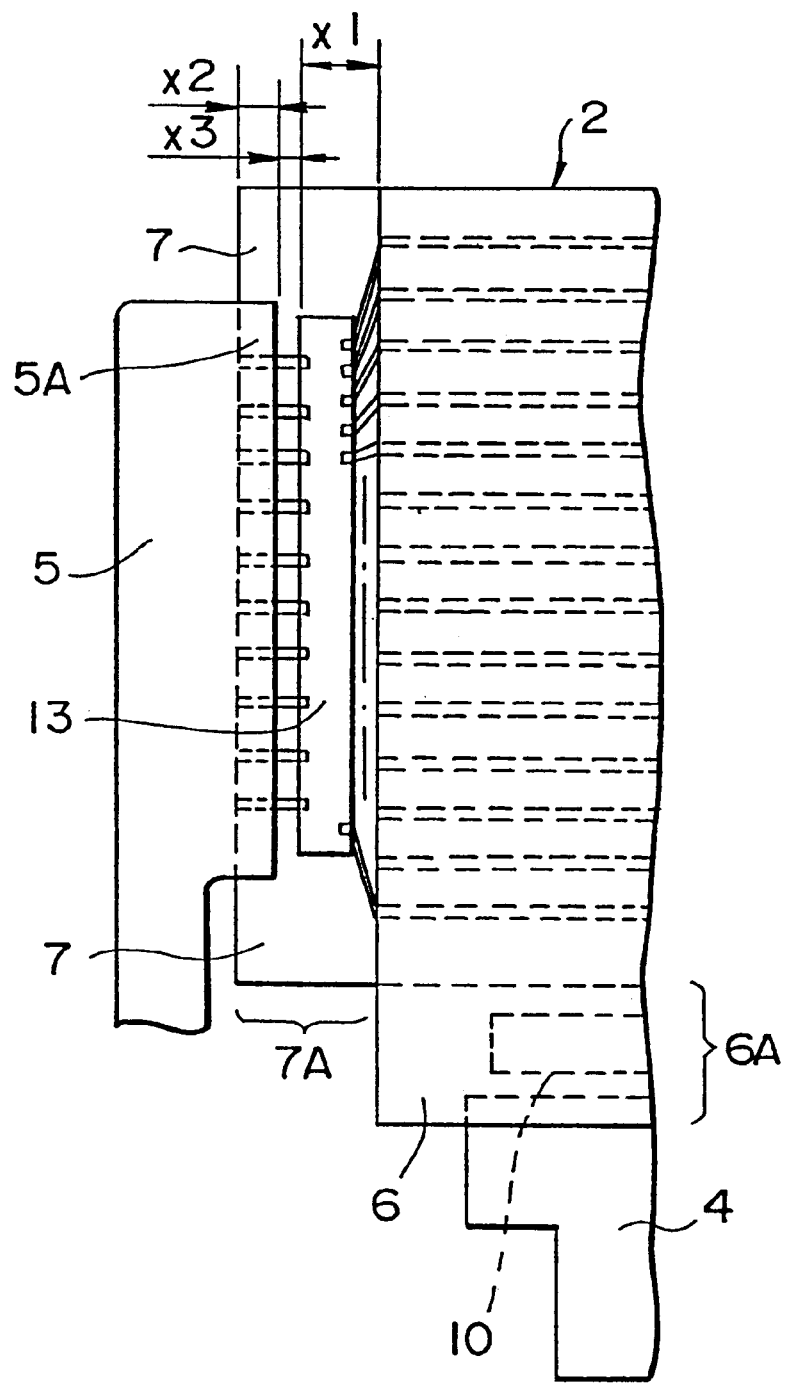
FIG. 10 is an enlarged plan view of a principal part of the conventional liquid crystal display device.

In this way, in this embodiment, the connection terminals 33 are arranged in the second wiring connection area 25A so that the input terminals 33A thereof extend in a direction perpendicular to the scanning electrodes 28, that is, in a direction parallel to the signal electrodes 27. That is, the connection terminals 33 extend toward a long side of a rectangle formed by a portion of the second substrate 25 projected from the first substrate 24 (the second wiring connection area 25A) after being connected to the IC chip 32, and further, the input terminals 33A thereof are drawn out to an end of a short side of the rectangle. The connection terminals 33 are arranged in this way, whereby the flexible printed wiring board 22 is connected at a short side of the second wiring connection area 25A. Therefore, unlike the conventional example shown in FIG. 10, the width x2 of the output terminal area 5A of the flexible printed wiring board 5, the size x3 for separating the scanning driver IC chip 13 and the output terminal area 5A of the flexible printed wiring board 5, and a bending margin required for bending the flexible printed wiring board 5 are not required. As a result, the ratio of the display area accounting for the entire surface of the liquid crystal display panel 21 can be increased. Since the number of input terminals of the scanning driver IC chip 32 is considerably smaller than the number of output terminals, an arrangement area of the connection terminals does not get narrow even if input terminal 33A to the scanning driver IC chip 32 is arranged along the short side of the wiring connection area 25A.

Figure 5:
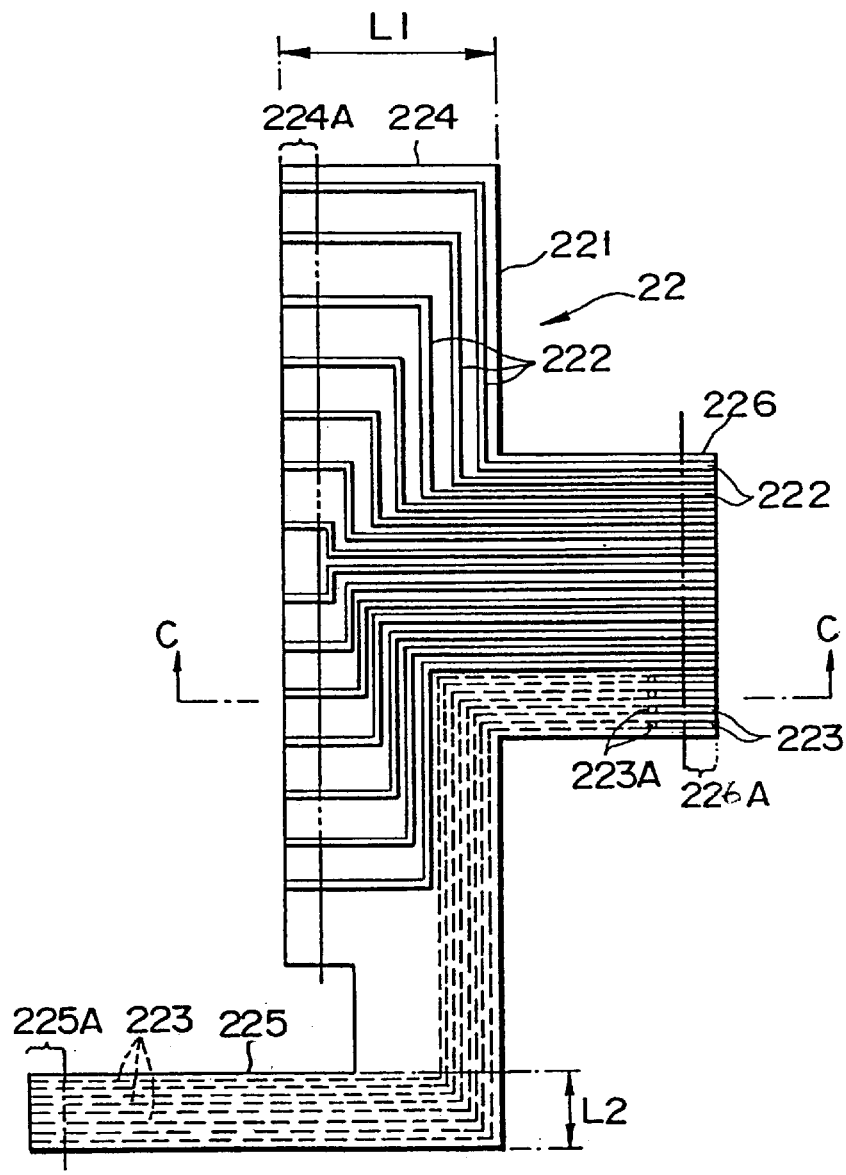
FIG. 5 is a plan view showing an embodiment of a flexible printed wiring board according to the present invention.
Figure 6:
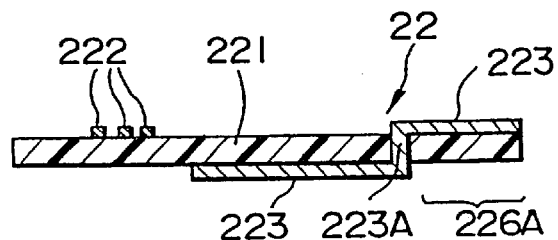
FIG. 6 is a sectional view taken along the line C—C in FIG. 5.

Next, the construction of the flexible printed wiring board 22 in this embodiment will be described. FIG. 5 is a plan view of the flexible printed wiring board 22. FIG. 6 is a sectional view taken along the line C—C in FIG. 5.

The flexible printed wiring board 22 has a flexible substrate 221 formed of, for example, electrically insulating resin, and wiring, that is, a plurality of signal wiring 222, a plurality of scanning wiring 223, and other wiring (not shown) formed as necessary are formed on both sides of the flexible substrate 221.

The flexible printed wiring board 22 includes a board main body 224 having an end with a long width (shown by the numeral L1 in FIG. 5), a branch wiring section 225 with a short width (shown by the numeral L2 in FIG. 5) which branches into an L-shape from one side of the board main body 224 to project forward (opposite side of an input wiring section 226, that is, toward the side on which an first output terminal area 224A is arranged), and the input wiring section 226 projecting backward (rightward in FIG. 5) from the back of the board main body 224. A front end of the board main body 224(leftward in FIG. 5) constitutes the first output terminal area 224A, a front end of the branch wiring section 225 constitutes a second output terminal area 225A, and an end of the input wiring section 226 constitutes an input terminal area 226A.

On the surfaces of the board main body 224 and the input wiring section 226, a plurality of signal wiring 222 is arranged between the first output terminal area 224A and the input terminal area 226A. A plurality of scanning wiring 223 is arranged from the second output terminal area 225A of the branch wiring section 225 to the input terminal area 226A of the input wiring section 226.

An arrangement direction of the data signal wiring 222 on the first output terminal area 224A is same as an arrangement direction of the scanning signal 223 on the second output terminal area 225A.

The scanning wiring 223 is formed along the back of the flexible substrate 221 from the branch wiring section 225 to an intermediate portion of the input wiring section 226. This scanning wiring 223 is formed so as to reach the surface of the flexible substrate 221 via through holes 223A formed in the intermediate portion of the input wiring section 226. For this reason, all of the signal wiring 222 and the scanning wiring 223 is arranged on the surface of the flexible substrate 221 in the input terminal area 226A of the input wiring section 226.

In this way, in the flexible printed wiring board 22 of this embodiment, wiring (signal wiring 222 and scanning wiring 223) is formed on the surface of the flexible substrate 221 at the board main body 224 and the input wiring section 226, and the scanning wiring 223 is formed on the back surface of the flexible substrate 221 at the branch wiring section 225. While the scanning wiring 223 is formed on both sides of the flexible substrate 221 via the through holes 223A in this embodiment, conversely, the signal wiring 222 may be formed to exist on both sides via through holes and arranged on the same plane with the scanning wiring in the input terminal area 226A of the input wiring section 226.

Alternatively, two single-side flexible substrates bonded to each other may be used as the flexible printed wiring board 22. Firstly, a first single-sided flexible substrate having at least the input wiring section 226 of the board main body 224 and wiring (signal wiring 222 and scanning wiring 223) formed on one side of the first single sided flexible substrate with a resist formed thereon is used. Furthermore, a second single-sided flexible substrate having at least the scanning wiring 223 of the branch wiring section formed on one side of the second single sided flexible substrate and with a resist formed thereon is used. Then, the first and second single-sided flexible substrates may be bonded to each other via the resists so that the surfaces having wiring formed thereon oppose each other, and the scanning wiring 223 can produce electrical continuity at predetermined positions via through holes formed in the resists.

Figure 3:
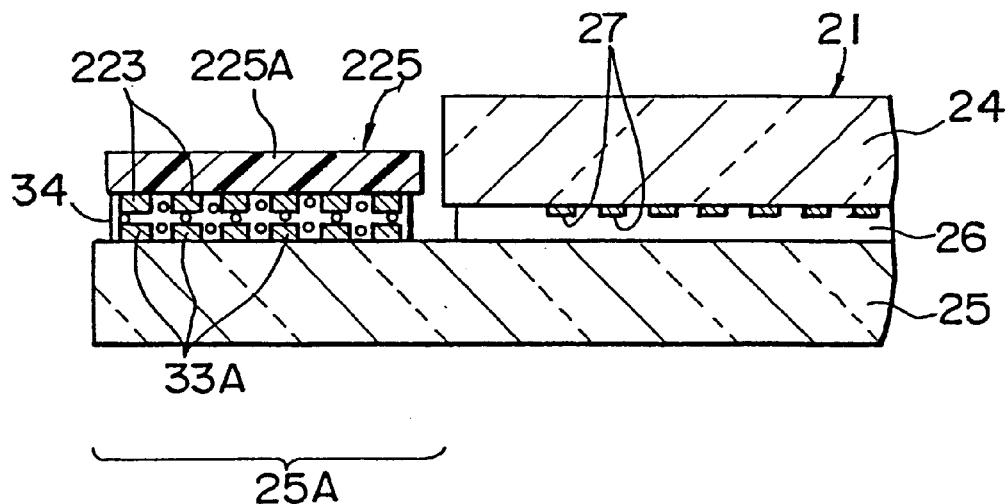
FIG. 3 is a sectional view taken along the line A—A in FIG. 2.
Figure 4:
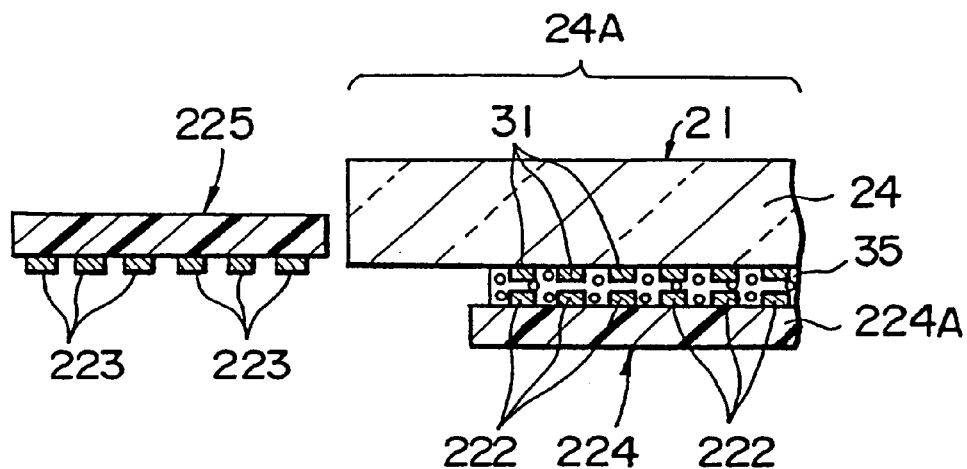
FIG. 4 is a sectional view taken along the line B—B in FIG. 2.

The connection structure of the thus-constructed flexible printed wiring board 22 and the above-described liquid crystal display panel 21 will be described with reference to FIGS. 3 and 4. FIG. 3 is a sectional view taken along the line A—A in FIG. 2, and FIG. 4 is a sectional view taken along the line B—B in FIG. 2.

As shown in FIG. 3, the scanning wiring 223 arranged on the back surface of the second output terminal area 225A of the branch wiring section 225 is connected via an anisotropic conductive film (ACF) 34 so as to correspond to the plurality of input terminals 33A arranged along the short side of the wiring connection area 25A of the second substrate 25. On the other hand, as shown in FIG. 4, terminals of the signal wiring 222 formed on the first output terminal area 224A of the board main body 224 of the flexible printed wiring board 22 are connected via the anisotropic conductive film 35 so as to correspond to the plurality of connection terminals 31 arranged on the long side of the wiring connection area 24A of the first substrate 24.

The printed board 23 has a wiring circuit having various types of electronic elements 231, such as a power source IC chip, mounted thereon, as shown in FIG. 1. The printed board 23 includes connections 232 which are electrically connected to wiring terminals (signal wiring 222 and scanning wiring 223) of the input terminal area 226A of the input wiring section 226 of the flexible printed wiring board 22. The input terminal area 226A of the input wiring section 226 of the flexible printed wiring board 22 is electrically connected to the connections 232 via a anisotropic conductive film or a connector (not shown).

Figure 7:
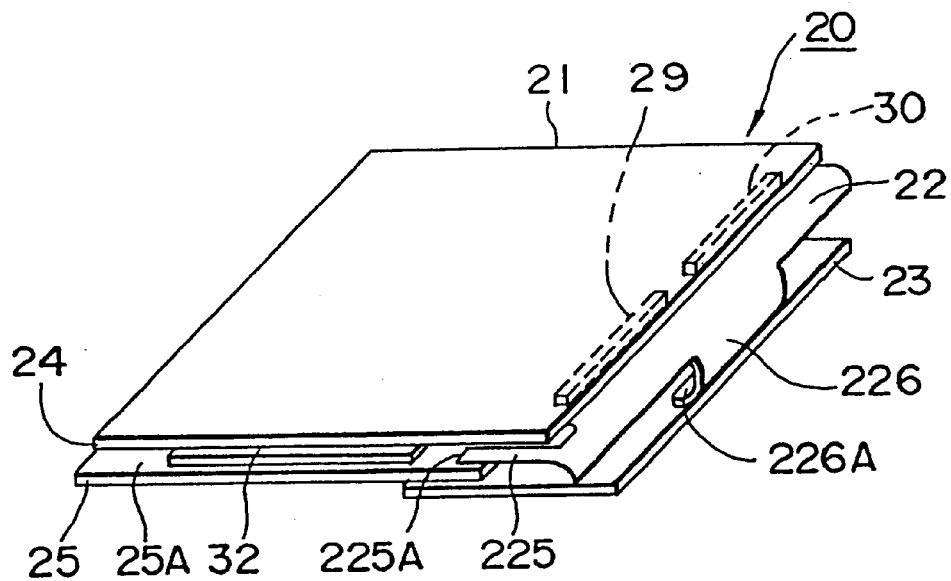
FIG. 7 is a perspective view of a liquid crystal display device of the embodiment.

FIG. 7 is a perspective view showing a state in which the liquid crystal display panel 21 and the printed board 23 are connected by the flexible printed wiring board 22, and a state in which the flexible printed wiring board 22 is flexed and the printed board 23 is arranged behind the liquid crystal display panel 21.

Next, the main action and effect of the liquid crystal device according to the present invention will be described.

In this embodiment, by connecting the second output terminal area 225A of the flexible printed wiring board 22 and the connection terminals 33 on the short side of the second wiring connection area 25A, the connection margin and bending margin of the flexible printed wiring board at least on one side of the liquid crystal panel 21 are not required. Therefore, the wiring connection area 25A on the substrate 25 can be made smaller, and the ratio of the display area accounting for the whole of the liquid crystal display panel 21 can be increased. By increasing the ratio of the display area in this way, display visibility can be improved.

According to this embodiment, since the flexible printed wiring board 22 can be connected in one direction (X direction in FIG. 1) of the liquid crystal display panel 21, a terminal connecting step can be simplified. Furthermore, according to this embodiment, since the first wiring connection area 24A formed on the first substrate 24 and the second wiring connection area 25A formed on the second substrate 25 can be connected using the single flexible printed wiring board 22, convenience of the flexible printed wiring board 22 can be improved.

Furthermore, since the input wiring section 226 of the flexible printed wiring board 22 can be connected to the printed board 23 at one place, a connecting step of the flexible printed wiring board 22 and the printed board 23 can be simplified. Since the flexible printed wiring board 22 can be connected to the printed board 23 at one place, the size of the printed board 23 can be reduced.

(1) First Modification

Figure 11:
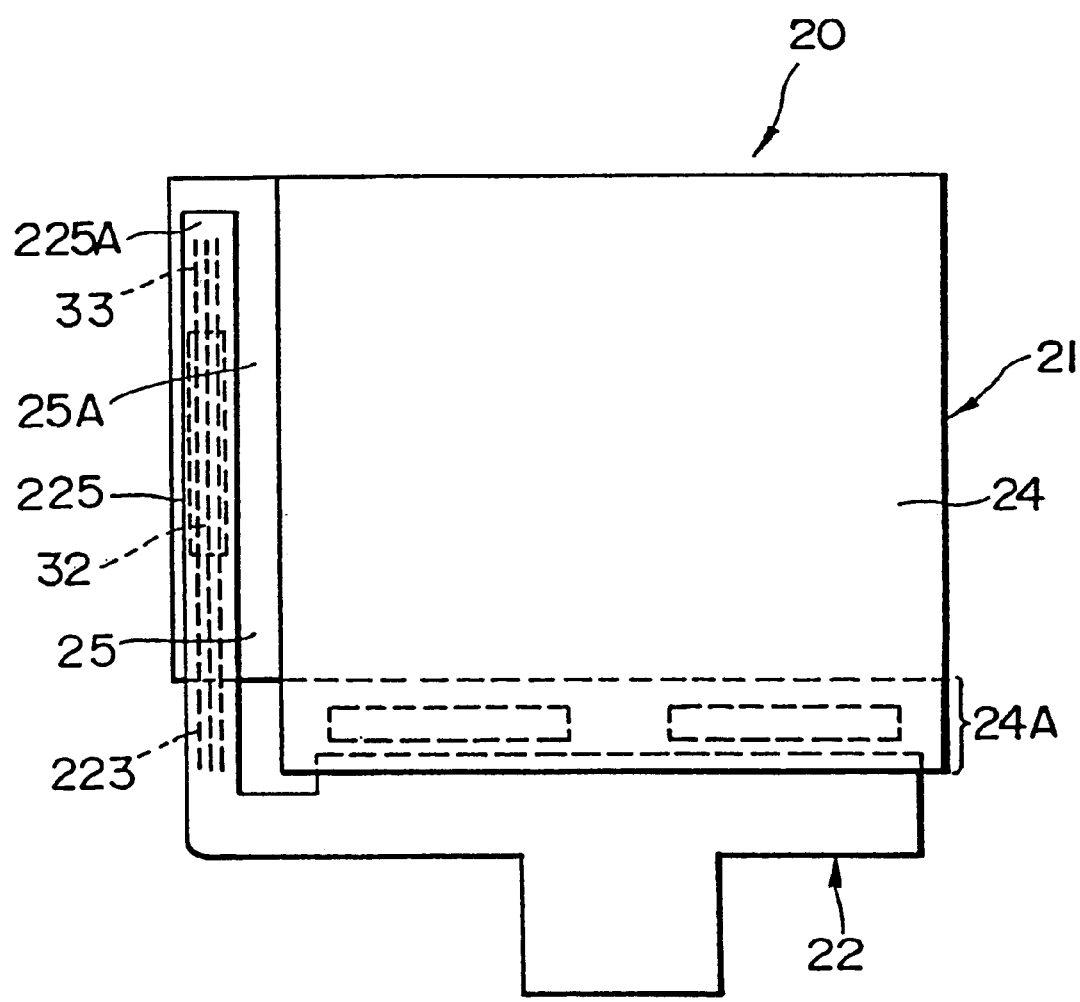
FIG. 11 is a plan view showing a first modification of the liquid crystal display device of the embodiment.

FIG. 11 shows a modification of a branch wiring section 225 of a flexible printed wiring board 22. In FIG. 11, portions having substantially the same functions as those in FIGS. 1, 2, 5, and 6 are indicated by the same reference numerals, and a detailed description thereof will be omitted.

In a liquid crystal panel 21 shown in FIG. 11, connection terminals 33 of a second wiring connection area 25A are drawn out in the opposite direction to the driver IC 32 of the embodiment shown in FIG. 1 (upward direction in the figure, that is, opposite side where a first substrate 24 projects from a second substrate 25).

In a flexible printed wiring board 22 shown in FIG. 11, the branch wiring section 225 is formed so as to extend along the long side of the second wiring connection area 25A of the second substrate 25. A scanning driver IC chip 32 is provided between the branch wiring section 225 and the second wiring connection area 25A of the second substrate 25. The connection terminals 33 of the second wiring connection area 25A and the scanning wiring 223 of the branch wiring section 225 are connected at a pointed end 225A of the branch wiring section 225.

(2) Second Modification

Figure 12:
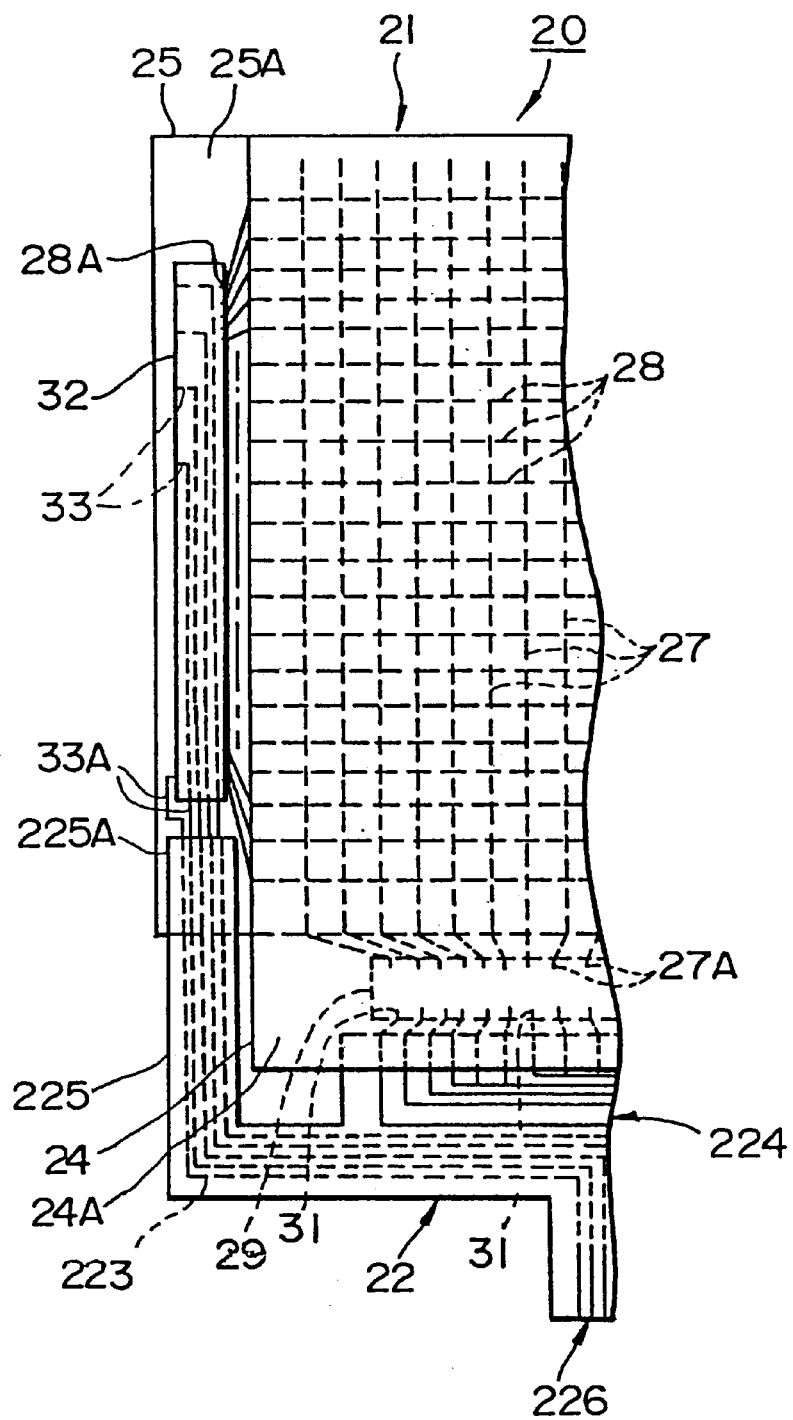
FIG. 12 is a partial plan view showing a second modification of the liquid crystal display device of the embodiment.

FIG. 12 shows a modification of a branch wiring section 225 of a flexible printed wiring board 22. In FIG. 12, portions having substantially the same functions as those in FIGS. 1, 2, 5, and 6 are indicated by the same reference numerals, and a detailed description thereof will be omitted.

In a liquid crystal panel 21 shown in FIG. 12, a second output terminal area 225A is provided adjacent to a scanning driver IC chip 32 which is mounted in the second wiring connection area 25A. With this construction, the length of connection terminals 33 for connecting the scanning driver IC chip 32 and scanning wiring 223 of the output terminal area 225A can be shortened. As a result, the resistance of the connection terminals can be reduced since the length of the connection terminals 33 can be further shortened when the connection terminals 33 are, for example, formed of a material having conductivity lower than that of a metal, such as ITO.

The distance between the second output terminal area 225A and the scanning driver IC chip 32 can be set within a range which does not interfere with a connecting step of the second output terminal area 225A. Therefore, while the distance depends on a connecting method, it can be set to, for example, 0.5 to 2.5 mm.

In this modification, the connection terminals 33 may only be connected to the scanning wiring 223 of the output terminal area 225A, and the length and pattern thereof can be suitably set. For example, the connection terminals 33 may be extended to an end of the short side of the wiring connection area 25A in a manner similar to the structure shown in FIG. 2. Alternatively, the connection terminals 33 may not be formed on the end of the short side of the wiring connection area 25A. That is, the connection terminals 33 are not extended to the end of the short side, but the connection terminals 33 may be formed so as to extend to an arbitrary intermediate position between the end of the short side and a short side end where the IC chip 32 and the flexible printed board are connected in the wiring connection area 25A.

(3) Third Modification

Figure 13:
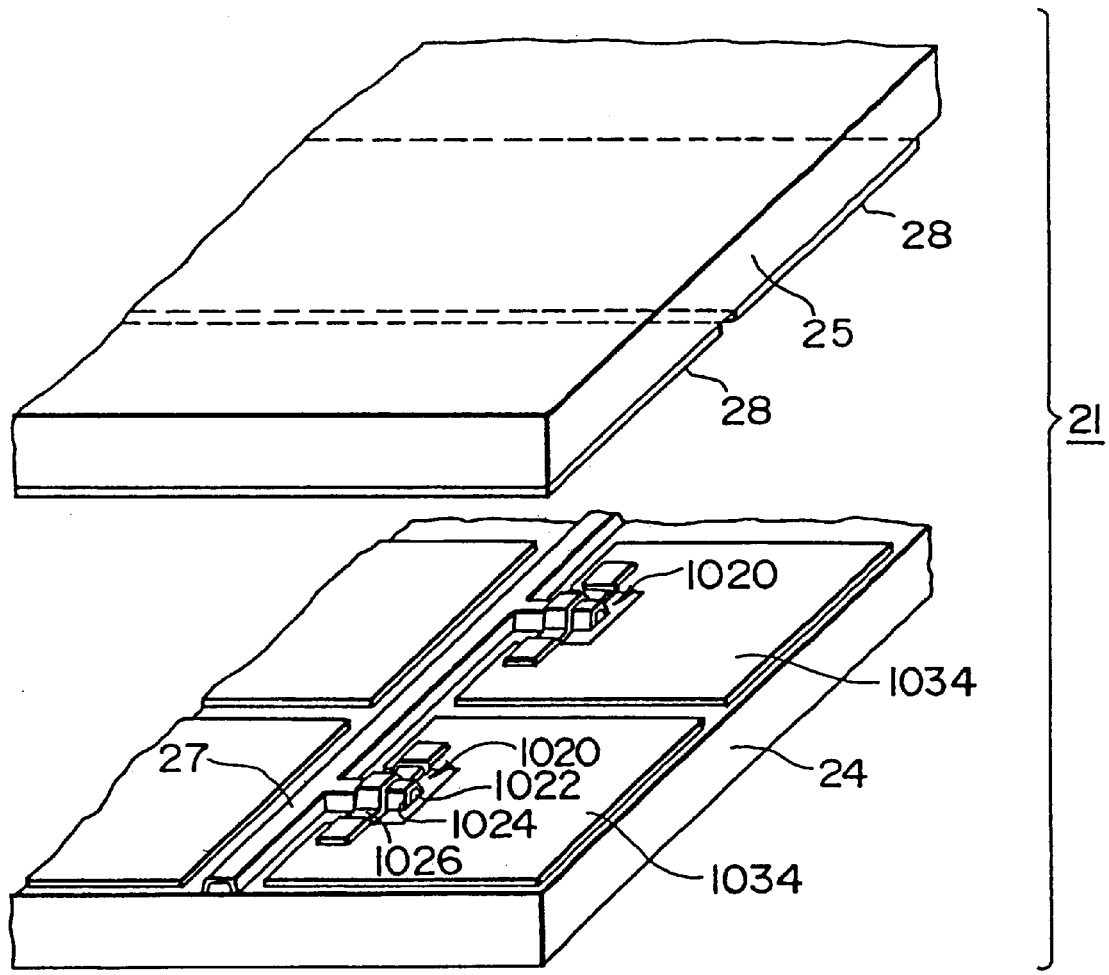
FIG. 13 is a perspective view showing a third modification of the liquid crystal display device of the embodiment.

FIG. 13 shows a modification of a liquid crystal panel 21. In FIG. 13, portions having substantially the same functions as those in FIGS. 1 and 2 are indicated by the same reference numerals, and a detailed description thereof will be omitted.

In the liquid crystal panel shown in FIG. 1, an example is shown in which the flexible printed wiring board of the present invention is applied to the passive-matrix-driven-type liquid crystal panel. However, the flexible printed wiring board of the present invention can also be applied to an active-matrix-driven-type liquid crystal panel using TFD elements as switching elements of pixel electrodes.

Since the structures of the first connection area 25A and the second connection area 26A are similar to those of the liquid crystal panel shown in FIG. 1, the structure inside a sealing material is shown in FIG. 13.

The liquid crystal panel 21 has a first substrate 24 and a second substrate 25 which are arranged to oppose each other. A sealing material (not shown) is provided between the first and second substrate 24 and 25 so as to surround a display area. Liquid crystal layer (not shown) is sealed in an area formed by the first and second substrates 24 and 25 and the sealing material. The first and second substrates 24 and 25 are composed of, for example, a glass substrate or a plastic substrate.

On a surface of the first substrate 24 opposing the second substrate 25, a plurality of pixel electrodes 1034 are arranged in a matrix and a signal electrode 27 extending in the X direction is arranged, and each of one line of the pixel electrodes 1034 is commonly connected to the single signal electrode 27 via TFD elements 1020. The pixel electrodes 1034 are formed of a conductive material which is transparent to display light, such as ITO (Indium Tin Oxide). As seen from the side of the substrate 24, each TFD element 1020 is composed of a first metal film 1022, an oxide film 1024 that is obtained by anodizing the first metal film 1022, and a second metal film to take a sandwich structure of metal/insulator/metal. For this reason, the TFD element 1020 has diode-switching characteristics in both positive and negative directions.

On the other hand, on a surface of the second substrate 25 opposing the first substrate 24, a plurality of scanning electrodes 28 are arranged. These scanning electrodes 28 are arranged in parallel with each other at predetermined intervals along a predetermined direction perpendicular to the signal electrodes 27 (Y direction in FIG. 13), and are aligned so as to be counter electrodes of the pixel electrodes 1034. While a color filter is omitted in FIG. 13, it is provided corresponding to an area where the scanning electrodes 28 and the pixel electrodes 1034 intersect each other.

The liquid crystal display panel 21 has a first wiring connection area 24A and a second wiring connection area 25A at two adjacent sides thereof in a manner similar to the embodiment shown in FIGS. 1 and 2, and can be connected to the flexible printed wiring board of the present invention (for example, the flexible printed wiring board shown in FIGS. 5 and 6, the flexible printed wiring board shown in FIG. 11, or the flexible printed wiring board shown in FIG. 12) in a manner similar to the embodiment shown in FIG. 1.

Figure 8:
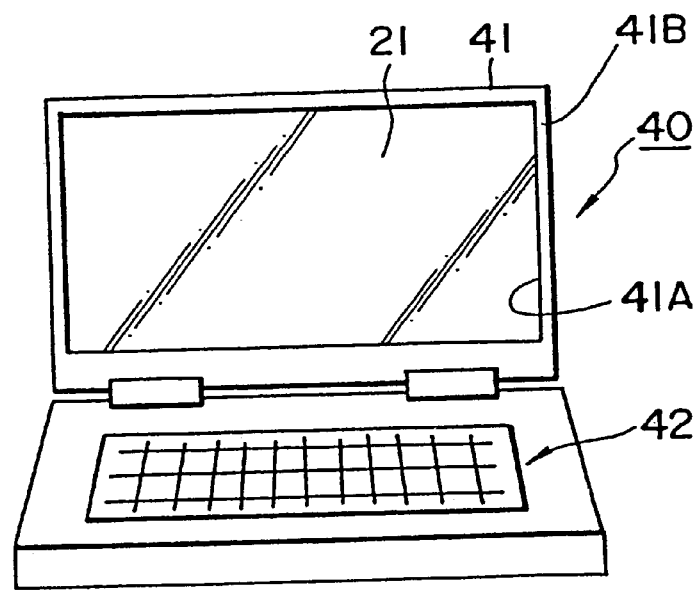
FIG. 8 is a perspective view showing an embodiment of an electronic equipment (personal computer) according to the present invention.
Figure 9:
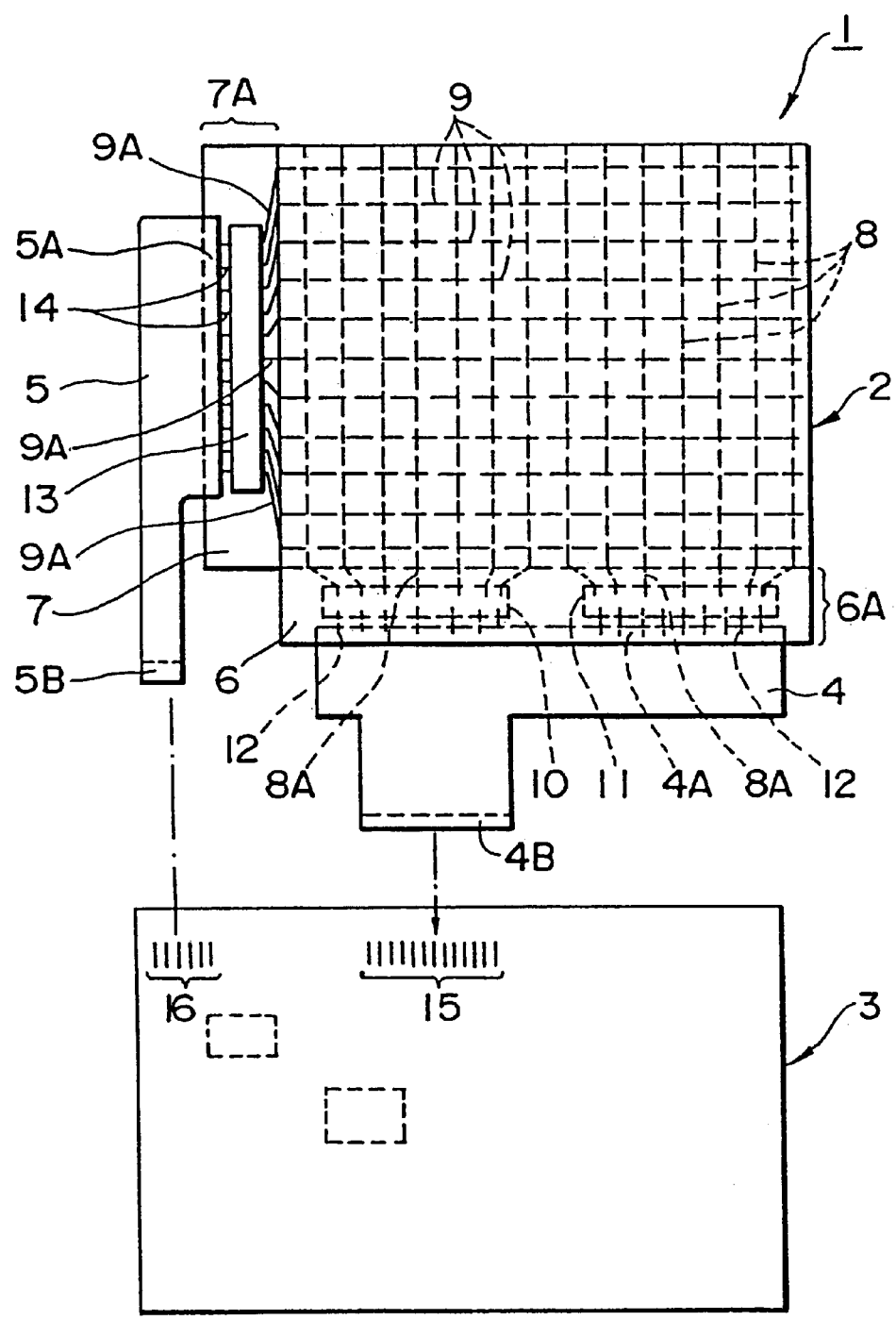
FIG. 9 is an exploded plan view of a conventional liquid crystal display device.

Next, the construction of a notebook-size personal computer 40 as an electronic equipment which uses a liquid crystal display device 20 of this embodiment as a display unit will be described with reference to FIG. 8. As shown in the figure, a construction is such that a liquid crystal display panel 21 is accommodated in a casing 41, and a display area of the liquid crystal display panel 21 is exposed from an opening 41A formed in the casing 41. The personal computer 40 includes a keyboard 42 as an input unit.

In the display unit of the personal computer 40, the width of both left and right sides of a frame 41B of the casing 41 surrounding the display area can be narrowed. That is, as shown in FIG. 7, since a connection margin for connecting the flexible printed wiring board 22 is not required for the long side of the wiring connection area 25A of the second substrate 25, the projection size of the wiring connection area 25A can be reduced. For this reason, when the size of the personal computer 40 is reduced, the size of the liquid crystal display panel 21 can be reduced, and by using the liquid crystal display panel 21 of this embodiment, the ratio of the display area in the total area of the liquid crystal display panel can be increased. Thus, by narrowing the width of the frame 41A of the casing 41, the area ratio of the display unit of the personal computer 40 can be increased.

Figure 14:
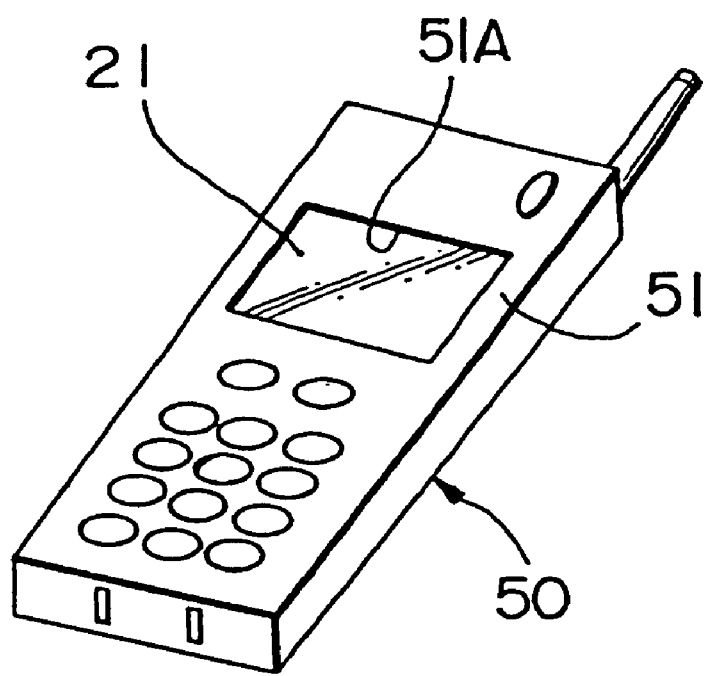
FIG. 14 is a perspective view showing an embodiment of an electronic equipment (mobile phone) according to the present invention.

FIG. 14 is an outward perspective view showing a mobile phone 50 as the electronic equipment according to the present invention. A construction is such that a liquid crystal display panel 21 is accommodated in a casing 51 at the upper part of the entire surface of the mobile phone 50, and a display area of the liquid crystal display panel 21 is exposed from an opening 51A formed in the casing 51.

In this way, this embodiment can contribute to a reduction in size of the personal computer, the mobile phone, and other various types of electronic equipment, such as a pager, a liquid crystal television, a view finder, a car navigation device, an electronic notebook, an electronic calculator, a word processor, or a picture phone.

While the embodiment has been described above, the electro-optical device, the flexible printed wiring board, and the electronic equipment according to the present invention are not limited to the above-described construction, and various changes can be made within the scope of the invention. For example, the liquid crystal device is not limited to a reflective liquid crystal device, and a transflective or a transmissive liquid crystal device can be applied. In addition, as the electro-optical device, an EL display device, a plasma display panel, or a FED panel can be applied. The EL display device uses an electroluminescent material including fluorescent material as the electro-optical material, and the scanning electrodes and the signal electrodes can be constructed in a manner substantially similar to the liquid display device. Furthermore, while the signal electrodes 27 are composed of a material which is transparent to the display light, and the substrate 24 having the signal electrodes 27 formed thereon is set to the front substrate in the above-described embodiment, transparent scanning electrodes may be formed on the front substrate.

In the above-described embodiment, the arrangement of the signal wiring 222 or the scanning wiring 223 formed on the flexible printed wiring board 22 may be suitably varied according to the layout of the connection of the liquid crystal display panel 21.

What is claimed is:

1. An electro-optical device having an electro-optical panel and a wiring board, the electro-optical device comprising:

the electro-optical panel including:
  a first substrate;
  a second substrate overlapping the first substrate along an overlapping area;
  a first wiring connection area included in the first substrate and extending from the overlapping area;
  a second wiring connection area included in the second substrate, and extending from the overlapping area;
  a set of first connection terminals arranged in the first wiring connection area; and
  a set of second connection terminals arranged in the second wiring connection area;
  the first set and the second set of connection terminals being arranged in the second wiring connection area;
  the first and the second sets of connection terminals being arranged in substantially the same direction;
the wiring board including:
  a board main body;
  a first output terminal area included in the main body;
  a plurality of wires formed on the first output terminal area, each of the wires being connected to the respective first connection terminal;
  a branch wiring section branched from the board main body;
  a second output terminal area included in the branch wiring section;
  a second plurality of wires formed on the second output terminal area, each of the second wires being connected to the respective second connection terminal; and
  the first and the second output terminal areas being arranged respectively on opposite sides of the wiring board;
a signal electrode formed on at least one of the first and the second substrates;
a scanning electrode formed on at least another of the first and the second substrates, the scanning electrode intersecting with the signal electrode;
a first IC chip arranged on the first wiring connection area and connected to the signal electrode;

a second IC chip arranged on the second wiring connection area, the second IC chip having a first and a second edge opposite each other, the first edge being proximate to the overlapping area;

wherein a second IC chip terminal proximate to the first edge is connected to the scanning electrode;

wherein the first connection terminals are connected to the first IC chip; and wherein the second connection terminals are connected to a plurality of second IC chip terminals proximate to the second edge of the second IC chip.

2. An electro-optical device according to claim 1, wherein a semiconductor device is mounted in at least one of the first wiring connection area and the second wiring connection area.

3. An electro-optical device according to claim 1, wherein the wires and the second wires include signal wires and scanning wires, wherein at least a part of the signal wires are provided in the first output terminal area, wherein at least a part of the scanning wires are provided in the second output terminal area.

4. An electro-optical device according to claim 1 further comprising:
  an input terminal area in the wiring board;
  wherein the wires in the first output terminal area and the wires in the second output terminal area extend to the input terminal area; and
  wherein the wires in the input terminal area and in the first output terminal area are arranged on a same side of the wiring board.

5. An electro-optical device according to claim 1 further comprising:
  an input terminal area formed in the wiring board; and
  a printed board connected to the input terminal area.

6. An electro-optical device according to claims 1, wherein a plurality of parallel scanning electrodes are formed on one of two opposing surfaces of the first substrate and the second substrate, and wherein a plurality of signal electrodes are formed on a second one of the two opposing surfaces in a crossing direction to the scanning electrodes.

7. An electro-optical device according to claim 1, wherein the electro-optical panel includes an electro-optical material layer, the electro-optical material layer includes a liquid crystal layer.

8. An electro-optical device as claimed in claim 1, further comprising electronic equipment.

9. An electro-optical device comprising:
  a first substrate;
  a second substrate overlapping the first substrate;
  a first wiring connection area included in the first substrate and extending from the overlapping area in a first direction;
  a second wiring connection area included in the second substrate and extending from the overlapping area in a second direction, the second direction being perpendicular to the first direction;
  an IC chip mounted in the second wiring connection area and having first and second edges facing opposite each other;
  an electrode formed on the second substrate extending from the overlapping area to the second wiring connection area, the electrode connected to an IC chip terminal proximate to the first edge of the IC chip;
  a connection terminal formed between the second edge of the IC chip and a peripheral edge of the second wiring connection area, the peripheral edge extending parallel to the second direction; and wherein at least a part of the connection terminal goes through an area between the IC chip and the second wiring connection area.

10. An electro-optical device according to claim 9, further comprising:

a discrete connection terminal formed in the second wiring connection area, the discrete connection terminal connected to an IC chip terminal proximate to the second side of the IC chip and extending toward one of the peripheral edges of the second wiring connection area so that the discrete connection terminal avoids going through an area under the IC chip.

11. An electro-optical device according to claim 9, wherein the connection terminal includes a material having a conductivity lower than that of Indium Tin Oxide.

12. An electro-optical device according to claim 1, wherein:

a first area of the first output terminal area containing the plurality of wires overlaps the first wiring connection area; and a second area of the second output terminal area containing the second plurality of wires overlaps the second wiring connection area.

* * * * *

UNITED STATES PATENT AND TRADEMARK OFFICE
CERTIFICATE OF CORRECTION

PATENT NO.     : 6,507,384 B1
DATED          : January 14, 2003
INVENTOR(S)    : Endo et al.

It is certified that error appears in the above-identified patent and that said Letters Patent is hereby corrected as shown below:

Column 1,
Line 10, after "relates", please insert -- to --;

Column 4,
Line 64, please delete "areas" and replace with -- area --;

Column 5,
Line 26, please delete "areas" and replace with -- area --;
Line 48, please delete "of";

Column 7,
Line 22, please delete "substrate 24" and replace with -- substrate 25 --;

Column 8,
Line 50, please delete "an" and replace with -- a --;
Line 67, after "is", please insert -- the --; and Column 14,
Line 36, please delete "claims 1" and replace with -- claim 1 --.

Signed and Sealed this

Twenty-sixth Day of August, 2003

JAMES E. ROGAN
*Director of the United States Patent and Trademark Office*